(12) United States Patent
Fröjdh

(10) Patent No.: US 6,639,679 B2
(45) Date of Patent: Oct. 28, 2003

(54) INTEGRATED WAVELENGTH MONITOR

(75) Inventor: Krister Fröjdh, Älvsjö (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 347 days.

(21) Appl. No.: 09/756,127

(22) Filed: Jan. 9, 2001

(65) Prior Publication Data

US 2001/0007501 A1 Jul. 12, 2001

(30) Foreign Application Priority Data

Jan. 10, 2000 (SE) ................................................ 0000041

(51) Int. Cl.⁷ .................................................. G01B 9/02
(52) U.S. Cl. ...................................... 356/454; 356/519
(58) Field of Search ................................. 356/519, 454, 356/480; 372/32

(56) References Cited

U.S. PATENT DOCUMENTS

| 4,815,081 A | 3/1989 | Mahlein et al. |
| 5,305,330 A | 4/1994 | Rieder et al. |
| 5,825,792 A | 10/1998 | Villeneuve et al. |
| 5,896,201 A | 4/1999 | Fukushima et al. |
| 6,186,937 B1 * | 2/2001 | Ackerman et al. .......... 356/454 |

FOREIGN PATENT DOCUMENTS

| EP | 277883 A3 | 8/1988 | |
| JP | 3200903 A | 9/1991 | |
| WO | WO95/20144 | 7/1995 | |
| WO | WO 95/20144 * | 7/1995 | ............. G01J/9/02 |

* cited by examiner

Primary Examiner—Frank G. Font
Assistant Examiner—Patrick Connolly
(74) Attorney, Agent, or Firm—Burns, Doane et al.

(57) ABSTRACT

An integrated wavelength monitor and a method for obtaining such a device are disclosed. The device suitable for integration into a laser semiconductor laser module for fiber optic communication can be made in the following way: An interference filter is created directly onto a position sensitive photo detector by depositing a number of layers of different optical transparent materials forming an optical filter. The interference filter may also be created separately and subsequently mounted directly on top of the detector. The integrated position sensitive device (13) is mounted with an angle behind a laser in the same position as a normal power monitor detector. The electrically derived lateral position of light hitting the Position Sensitive Device provided with the interference filter will be dependent of the wavelength of the incident light and this derived position is used for the wavelength monitoring.

10 Claims, 2 Drawing Sheets

INTEGRATED WAVELENGTH MONITOR

This application claims priority under 35 U.S.C. §§119 and/or 365 to 0000041-4 filed in Sweden on Jan. 10, 2000; the entire content of which is hereby incorporated by reference.

TECHNICAL FIELD

The present invention relates to wavelength monitoring of a laser light and more particularly to a method and a device for an integrated wavelength monitor for laser sub-modules.

BACKGROUND

Fiber-optical transmission is one of the main transfer methods for telecommunication today. Wavelength division multiplexing (WDM) is the preferred method to transfer several channels over an optical fiber. As transmitters Distributed Feedback lasers (DFB-lasers) with precisely controlled wavelengths are typically used for this.

The spacing between individual channels in WDM systems is typically down to 100 GHz corresponding to a spacing of 0.8 nanometer or 0.05% of the wavelength of the laser. To avoid interference between the channels a typical wavelength drift of ±0.1 nanometer must be guaranteed. At the system level today a separate unit for monitoring all channels is typically used.

There are several solutions disclosed for obtaining a wavelength monitoring and control for WDM optical transmission systems. U.S. Pat. No. 5,825,792 discloses a compact wavelength monitoring and control assembly for a laser emission source with a distributed feedback (DFB), which comprises an angled Fabry-Perot etalon and two separate photo-detectors, the differential output of which is used in the feedback loop for stabilizing the wavelength of the laser source.

Another U.S. Pat. No. 5,896,201 discloses an optical device for wavelength monitoring and control. The device has an optical element formed as a wedge for dividing a light beam into two differently reflected beams, which beams via a filter reach a first and second photo-detector. On the basis of a difference in wavelength characteristics, the wavelength of the light beam can be monitored according to outputs from the first and second photo-detectors.

Also an international application WO95/20 144 discloses an optical wavelength sensor consisting of a wedge shaped Fabry-Perot etalon which exhibits resonance for different optical wavelengths across its width and an array of detectors that detects the spatial disposition of resonant peaks which occurs.

Still another document U.S. Pat. No. 5,305,330 discloses a system comprising a laser diode and a system to stabilize the wavelength of the laser diode. The system comprises a beam splitter and a diffraction grating for measurement and a number of photo-detectors.

All solutions found so far are rather complex and are more or less difficult to simply implement in a standard laser device. However, a laser with an integrated wavelength monitor would be an attractive component on the market. Therefore there is a demand for a simple compact integrated device for monitoring of the wavelength of a laser device.

SUMMARY

A wavelength monitor suitable for integration into a laser semiconductor laser module for fiber optic communication can be made in the following way: An interference filter is deposited directly onto a position sensitive photo detector or mounted directly on top of the detector. The detector device is mounted with an angle behind the laser in the same position as a normal power monitor detector. The electrically derived lateral position of light hitting the Position Sensitive Device provided with the interference filter will be dependent of the wavelength of the incident light and this derived position is used for the wavelength monitoring.

A method for obtaining a wavelength monitor device according to the present invention is set forth by the independent claim 1 and the dependent claims 2–5. Furthermore, a device for controlling the wavelength of a laser source is set forth by the independent claim 6 and further embodiments of the device are set forth by the dependent claims 7–10.

BRIEF DESCRIPTION OF THE DRAWINGS

The invention, together with further objects and advantages thereof, may best be understood by making reference to the following description taken together with the accompanying drawings, in which.

DETAILED DESCRIPTION

Figure 1:
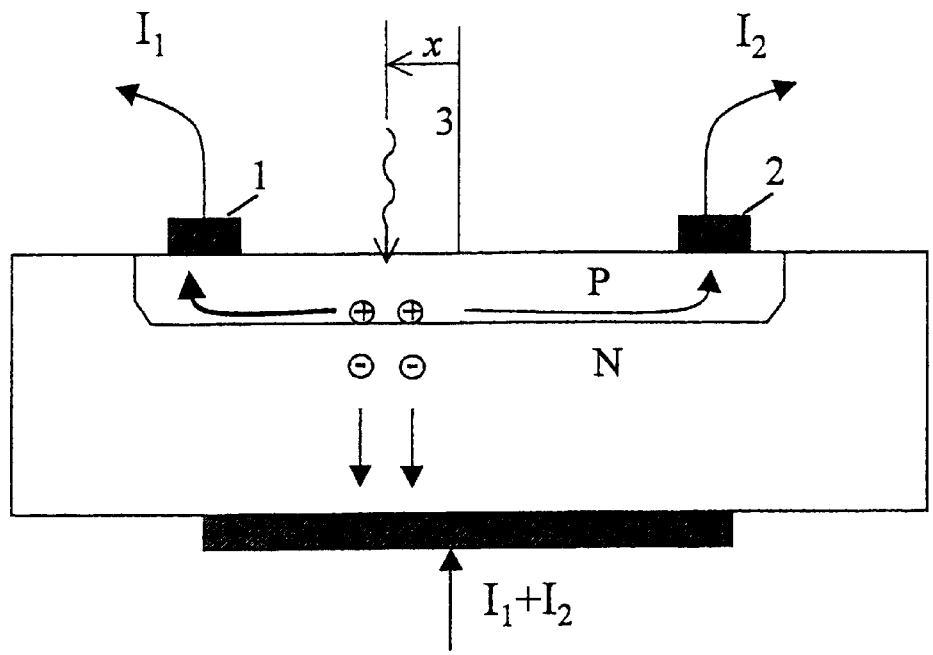
FIG. 1 illustrates a typical embodiment of a position sensitive diode according to the state of the art.

In FIG. 1 is demonstrated a general embodiment of a position sensitive diode. A position sensitive diode i a modification of an ordinary photodiode. By using two front electrodes 1 and 2, the photo-current generated by the incoming light 3 will be split between the front electrodes, generating currents $I_1$ and $I_2$ in the two front electrodes. The lateral position x of the light can then be extracted from the ratio of the two currents obtained. This constitutes the basic principle for a Position Sensitive Detector normally referred to as a PSD, to be utilized in the present application.

A wavelength monitor according to the present improvement is formed by an inventive combination of a Position Sensitive Detector and an Interference Filter. Thus, the PSD 10 constitutes a photo-detector, from which both position as well as intensity of incident light can be extracted. The PSD is obtained by applying several electrodes onto a photo diode detector. The position and intensity is then derived from the current observed in the respective electrodes.

Figure 2:
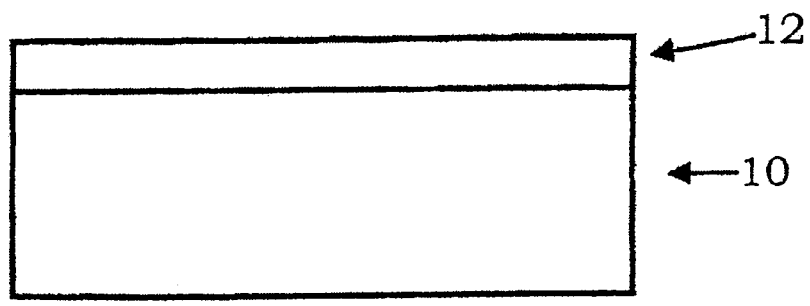
FIG. 2 illustrates a combination of a position sensitive photo detector and an interference filter according to the present invention.

In a basic embodiment demonstrated in FIG. 2 an interference filter 12 is fabricated on top of the PSD 10 by depositing a number of layers of different optical transparent materials. In yet another embodiment an interference filter is made separately and subsequently bonded to the Position Sensitive Detector chip 10. The resolution and wavelength range of the monitor can be controlled by the thickness of the spacer layer of the interference filter 12. The filter may for instance in a typical embodiment be shaped as a Fabry-Perot etalon. By using a low thermal expansion material as the spacing layer the temperature dependence can be minimized.

Figure 3:
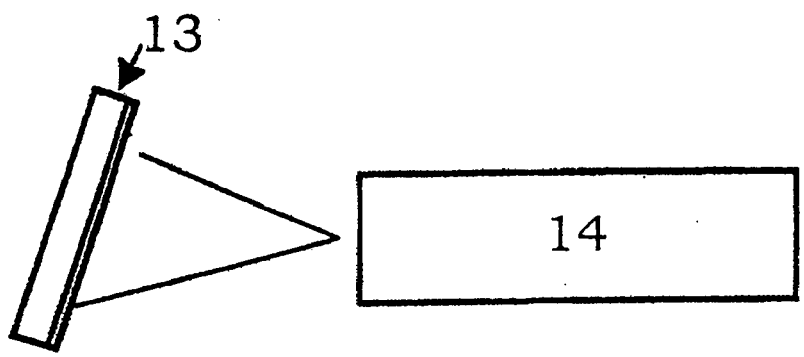
FIG. 3 illustrates a mounting of a integrated wavelength monitor according to FIG. 1 with an angle at a distance from the back facet of a laser device.

In a typical embodiment utilizing the present invention a wavelength monitor 13 made as indicated above is mounted with an angle at a distance from the back-facet of a laser 14 as illustrated in FIG. 3. Alternatively, some of the light from the front-facet can be directed to the monitor.

Figure 4:
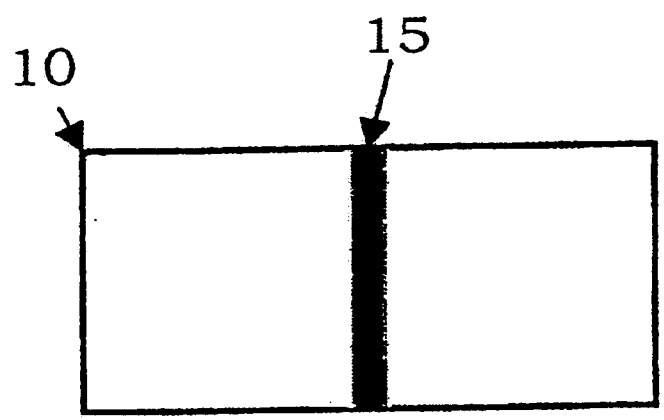
FIG. 4 illustrates a line formed by the deposited filter of the position sensitive device, the position of this line being dependent on the wavelength.

As only light incident at a specific angle will be transmitted through the filter 12, a line 15 as indicated in FIG. 4 will be formed on the position sensitive detector 10, whereby the position of the line is dependent on the wavelength. From the current of detected by the electrodes of the photo-detector, the wavelength of the light can then be extracted.

The detector is simple to fabricate using standard processes available. The present monitor can directly replace the power monitor used in current laser packages. Commercially produced Position Sensitive Detectors are for instance found at SiTek Electro Optics, Partille, Sweden.

By mounting the component 13 according to the present invention in front of an optical fiber a low cost, highly reliable wavelength meter is created. By using more electrodes in the PSD even the double modes of a laser could be detected. By measuring the wavelength signal resolved in time, the chirp of the laser is then easily monitored.

It will be understood by those skilled in the art that various modifications and changes may be made to the present invention without departure from the scope thereof, which is defined by the appended claims.

What is claimed is:

1. A method for obtaining a light wavelength monitor comprising the steps of utilizing a Position Sensitive Detector providing information of position and intensity of incident light by means of extracted current from a number detector electrodes;

positioning an interference filter directly on top of said Position Sensitive Detector to thereby form an integrated wavelength sensitive device;

mounting said formed wavelength sensitive device with an angle at a distance from a light source to have said wavelength sensitive device serve as a light wavelength monitor.

2. The method according to claim 1, comprising the further step of fabricating the interference filter directly on top of said Position Sensitive Detector by depositing a number of optical transparent layers of material forming an optical filter material layers.

3. The method according to claim 1, comprising the further step of separately fabricating the interference filter with an umber of layers of material and subsequently bond the obtained interference filter to said Position Sensitive Detector.

4. The method according to claim 1, comprising the further step of using a low thermal expansion material as spacing layer in the interference filter to minimize temperature dependence.

5. The method according to claim 1, comprising the further step of utilizing output signals derived from the position sensitive detector for controlling the wavelength of a laser light emitter.

6. A device for forming a light wavelength monitor comprising a Position Sensitive Detector, which is utilized for providing information of position and intensity of incident light by using current extracted from a number of position sensitive diode electrodes;

an interference filter being positioned directly on top of the Position Sensitive Detector thereby forming an integrated wavelength sensitive device, said wavelength sensitive device being mounted with an angle at a distance from a light source to have said wavelength sensitive device operate as a light wavelength monitor device.

7. The device according to claim 6, wherein said interference filter is fabricated directly on top of said Position Sensitive Device by depositing a number of layers of different optical transparent materials forming an optical filter for creating said integrated wavelength monitor device.

8. The device according to claim 6, wherein said interference filter is separately fabricated from a number of layers of different optical transparent materials forming the filter, which is subsequently bonded to said Position Sensitive Detector to thereby create said integrated wavelength monitor device.

9. The device according to claim 6, wherein a low thermal expansion material is used as a spacing layer in said interference filter to minimize temperature dependence.

10. The device according to claim 6, wherein a wavelength controller is formed by means of utilizing output signals derived from said Position Sensitive Detector for controlling the wavelength of a laser light emitter.

* * * * *